United States Patent
Beerens et al.

(10) Patent No.: US 8,736,815 B2
(45) Date of Patent: May 27, 2014

(54) POSITION SENSOR AND LITHOGRAPHIC APPARATUS

(75) Inventors: Ruud Antonius Catharina Maria Beerens, Roggel (NL); Antonius Franciscus Johannes De Groot, Someren (NL); Johannes Petrus Martinus Bernardus Vermeulen, Helmond (NL)

(73) Assignee: ASML Netherlands B.V., Veldhoven (NL)

( * ) Notice: Subject to any disclaimer, the term of this patent is extended or adjusted under 35 U.S.C. 154(b) by 477 days.

(21) Appl. No.: 13/105,731

(22) Filed: May 11, 2011

(65) Prior Publication Data

US 2011/0304839 A1      Dec. 15, 2011

Related U.S. Application Data

(60) Provisional application No. 61/352,999, filed on Jun. 9, 2010.

(51) Int. Cl.
| | | |
|---|---|---|
| *G01B 11/02* | (2006.01) | |
| *G03B 27/42* | (2006.01) | |
| *G03B 27/58* | (2006.01) | |
| *G03B 27/62* | (2006.01) | |
| *H02K 41/02* | (2006.01) | |
| *G03F 7/20* | (2006.01) | |
| *G03F 9/00* | (2006.01) | |

(52) U.S. Cl.
CPC .............. *G03F 7/70775* (2013.01); *G03F 9/70* (2013.01)
USPC .............. 355/72; 310/12.19; 355/53; 355/75; 356/499; 356/500

(58) Field of Classification Search
CPC ......... G03F 7/70; G03F 7/70775; G03F 9/70; G03F 9/7046; G03F 9/7049
USPC .............. 310/12.19; 355/53, 72, 75; 356/399, 356/400, 499, 500
See application file for complete search history.

(56) References Cited

U.S. PATENT DOCUMENTS

| | | |
|---|---|---|
| 6,891,598 B2 | 5/2005 | Van Der Zouw |
| 7,636,165 B2 | 12/2009 | Klaver et al. |
| 7,889,315 B2 | 2/2011 | Van De Kerkhof |

(Continued)

FOREIGN PATENT DOCUMENTS

| | | |
|---|---|---|
| EP | 1 901 041 | 3/2008 |
| JP | 4-270920 | 9/1992 |

(Continued)

OTHER PUBLICATIONS

Korean Office Action mailed Aug. 16, 2012 in corresponding Korean Patent Application No. 10-2011-0055736.
Japanese Office Action mailed Oct. 24, 2012 in corresponding Japanese Patent Application No. 2011-124078.

*Primary Examiner* — Toan Ton
*Assistant Examiner* — Colin Kreutzer
(74) *Attorney, Agent, or Firm* — Pillsbury Winthrop Shaw Pittman LLP

(57) ABSTRACT

A position sensor is configured to measure a position data of a target. The position sensor includes a radiation source configured to irradiate a radiation beam, a first grating configured to diffract the radiation beam in a first diffraction direction into at least a first order diffraction beam, and a second grating, arranged in an optical path of the first order diffraction beam, the second grating being configured to diffract the first order diffraction beam diffracted at the first grating in a second diffraction direction substantially perpendicular to the first diffraction direction. The second grating is connected to the target. A first detector is configured to detect at least a part of the beam diffracted by the first grating, and at least one second detector is configured to detect at least part of the beam diffracted by the first grating and the second grating.

18 Claims, 5 Drawing Sheets

(56) References Cited

U.S. PATENT DOCUMENTS

| | | |
|---|---|---|
| 8,111,377 B2 | 2/2012 | Cosijns et al. |
| 2004/0179181 A1 | 9/2004 | Van Der Zouw |
| 2007/0223007 A1 | 9/2007 | Klaver et al. |
| 2007/0242256 A1 | 10/2007 | Van De Kerkhof |
| 2008/0062432 A1* | 3/2008 | Sandig et al. .................. 356/499 |
| 2009/0001260 A1* | 1/2009 | Klaver et al. ............. 250/237 G |
| 2009/0115987 A1* | 5/2009 | Butler et al. .................... 355/67 |
| 2009/0180084 A1 | 7/2009 | Cosijns et al. |

FOREIGN PATENT DOCUMENTS

| | | |
|---|---|---|
| JP | 6-341861 | 12/1994 |
| JP | 2004-260163 | 9/2004 |
| JP | 2008-070363 | 3/2008 |
| JP | 2009-509156 | 3/2009 |
| JP | 2009-170908 | 7/2009 |
| KR | 10-2007-0101818 | 10/2007 |
| KR | 10-2009-0081351 | 7/2009 |

\* cited by examiner

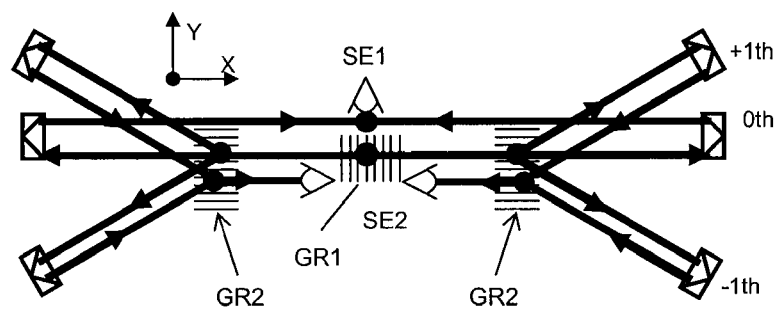
Fig. 7
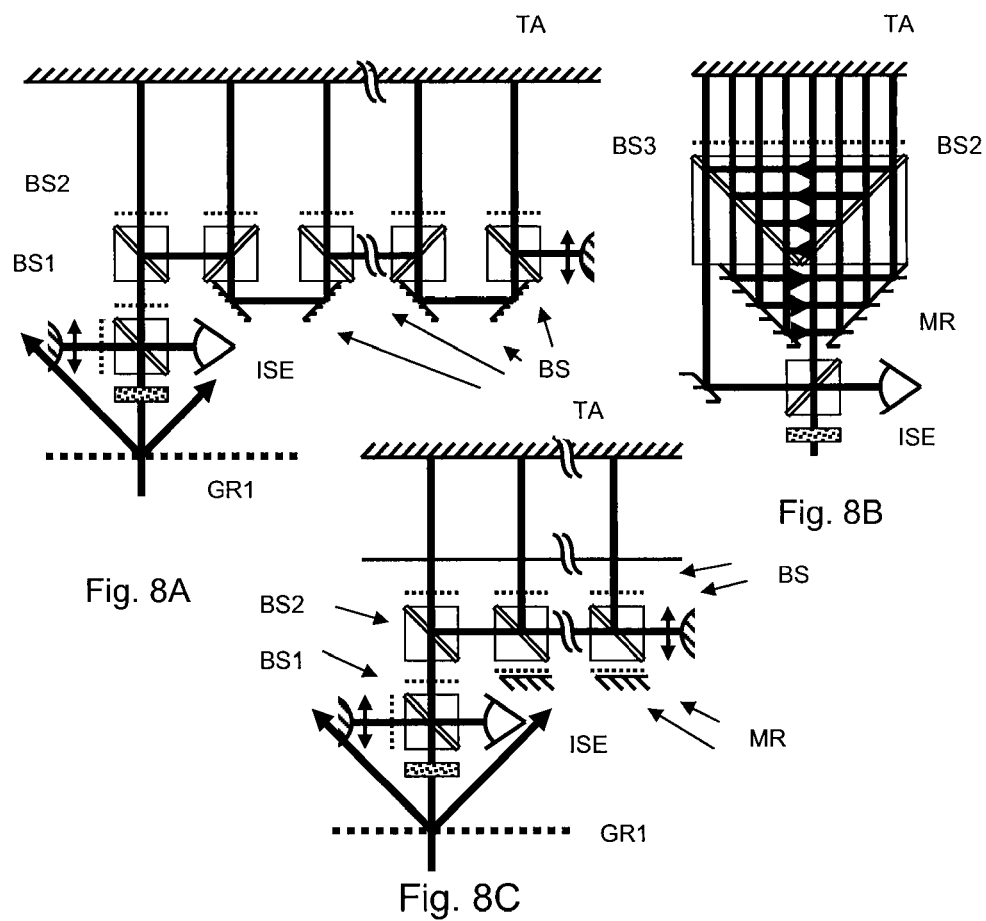
Fig. 8A
Fig. 8B
Fig. 8C

POSITION SENSOR AND LITHOGRAPHIC APPARATUS

CROSS REFERENCE TO RELATED APPLICATIONS

This application claims priority and benefit under 35 U.S.C. §119(e) to U.S. Provisional Patent Application No. 61/352,999, entitled "Position Sensor and Lithographic Apparatus", filed on Jun. 9, 2010. The content of that application is incorporated herein in its entirety by reference.

FIELD

The present invention relates to a position sensor, a lithographic apparatus including such position sensor and a use of such position sensor.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

Present trends in lithography tend towards an increase in throughput (i.e. an increase in the number of wafers to be processed per time unit) and an increase in resolution of the pattern, i.e. a decrease in the dimensions of the patterns to be provided onto the substrate. These requirements translate into an increase in scanning velocities of e.g. the substrate table that supports the substrate, as well as in an increase in accuracy, e.g. of the positioning of the substrate table, patterning device, etc. Such increase in speed may require a use of relatively lightweight stages (such as a substrate stage or a mask stage). Given the high velocities and corresponding accelerations such lightweight structures may evoke resonances, in other words not behave as rigid body masses. To be able to cope with such non rigid body behavior, multiple position sensing has been proposed so as to obtain over-determined position sensing information to thereby enable to sense non rigid body behavior of a part, such as a substrate table, patterning device support etc. Data obtained about the non rigid body behavior, such as about resonances, bending, expansion, etc, may be applied in actuator control systems so as to compensate for and/or counteract such behavior.

SUMMARY

It is desirable to provide a position sensor that can be integrated into a compact unit and that is able to provide position measurements in multiple degrees of freedom.

According to an embodiment of the invention, there is provided a position sensor configured to measure a position data of a target, the position sensor including:

an optical source configured to irradiate a radiation beam, the radiation beam having a propagation direction, a first and a second diffraction direction being defined as perpendicular to the propagation direction of the radiation beam and perpendicular to each other;

a first grating configured to diffract the radiation beam into at least a first diffraction beam having, due to the diffraction, a propagation direction component in the first diffraction direction;

a second grating, arranged in an optical path of the first diffraction beam, the second grating being configured to diffract the first diffraction beam diffracted at the first grating into at least a second diffraction beam having, due to the diffraction, a propagation direction component in the second diffraction direction perpendicular to the first diffraction direction;

the second grating being connected to the target, a first detector configured to detect at least a part of the first diffraction beam having been diffracted by the first grating, at least one second detector to detect at least part of the second diffraction beam having been diffracted by the first grating and the second grating.

In another embodiment of the invention, there is provided a lithographic apparatus arranged to transfer a pattern from a patterning device onto a substrate, including a stage and at least one position sensor according to an aspect of the invention configured to measure a position of the stage.

In yet another embodiment of the invention, there is provided a position sensor configured to measure a position data, the position sensor including:

an optical source configured to irradiate a radiation beam, the radiation beam having a propagation direction, a first and a second diffraction direction being defined as perpendicular to the propagation direction of the radiation beam and perpendicular to each other;

a first grating configured to diffract the radiation beam in a first diffraction direction into at least a diffraction beam having, due to the diffraction, a propagation direction component in the first diffraction direction a first retroreflector to reflect the diffraction beam back to the first grating so as to be diffracted again by the first grating;

at least one detector to detect at least part of the beam having been diffracted by the first grating, wherein the first retroreflector is configured to reflect the diffraction beam so as to be incident again on the first grating at substantially a same position seen along the first diffraction direction.

BRIEF DESCRIPTION OF THE DRAWINGS

Embodiments of the invention will now be described, by way of example only, with reference to the accompanying schematic drawings in which corresponding reference symbols indicate corresponding parts, and in which:

FIG. 7 depicts a schematic view of a position sensor according to again another embodiment of the invention; and FIG. 8A-C depict schematic views of position sensors according to again still other embodiments of the invention.

DETAILED DESCRIPTION

Figure 1:
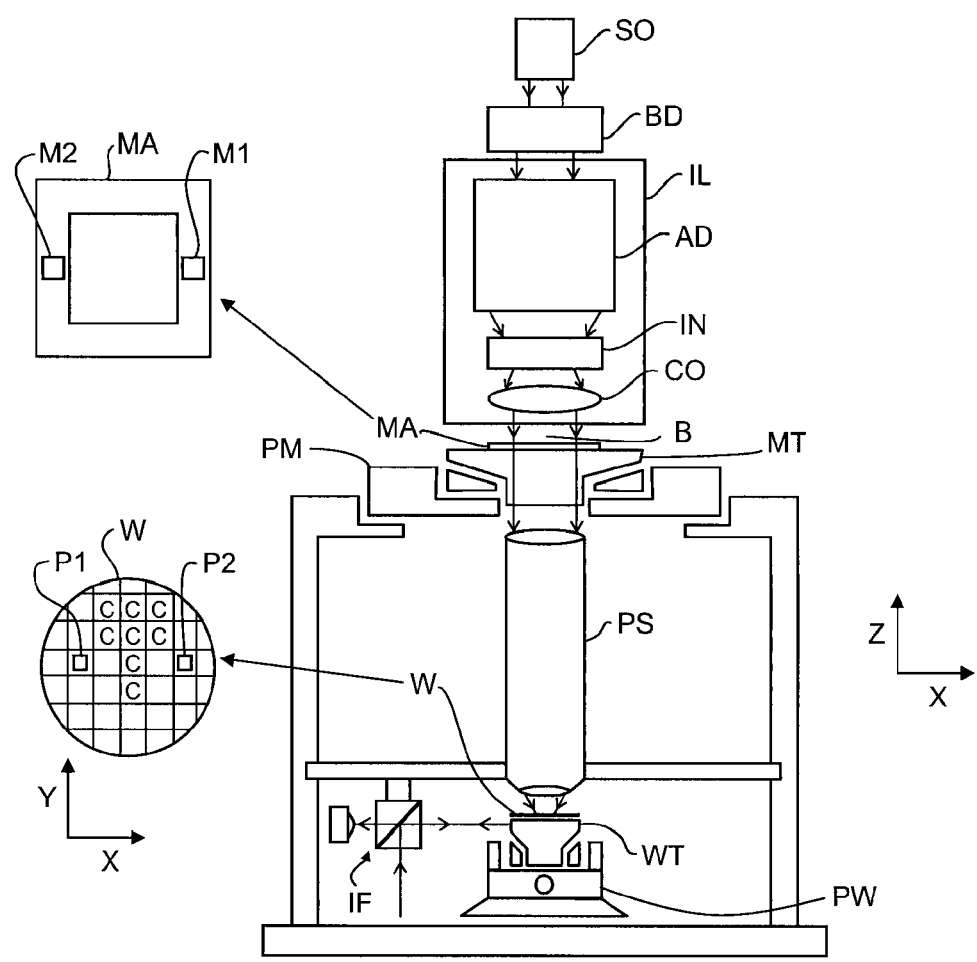
FIG. 1 depicts a lithographic apparatus in which the invention may be embodied.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, to direct, shape, or control radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the patterning device (e.g. mask) and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support (e.g., mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support (e.g. mask table) MT may be connected to a short-stroke actuator only, or may be fixed. Patterning device (e.g. mask) MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.
2. In scan mode, the patterning device support (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.
3. In another mode, the patterning device support (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
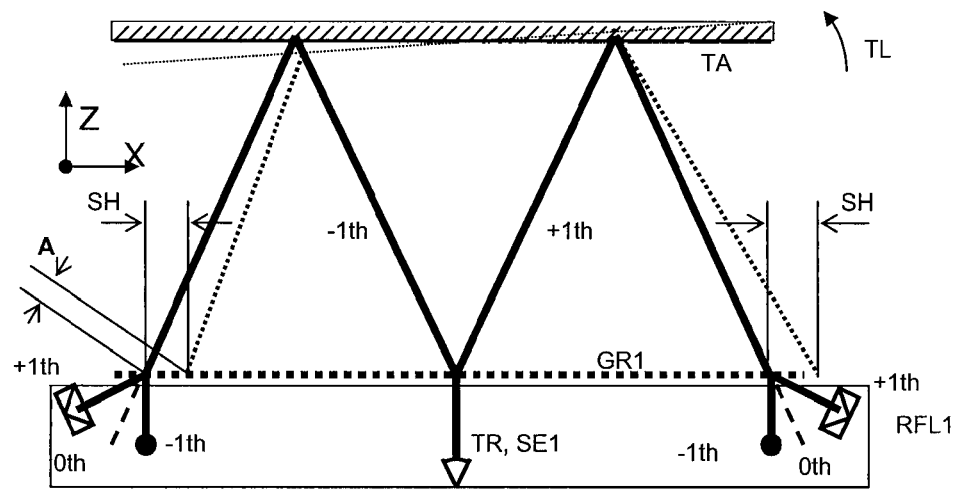
FIG. 2 depicts a schematic view of a position sensor according to an embodiment of the invention.

FIG. 2 depicts a side view of a position sensor that is arranged to sense a tilt TL of a target TA. The position sensor includes an optical source or radiation source, namely transmitter TR that transmits a radiation beam, such as a monochromatic beam in a visible, infrared or ultraviolet wavelength. The transmitter TR emits the beam to a first grating GR1, positioned substantially perpendicular to a direction of the beam. First order and minus first order diffraction beams are generated (other orders, such as zero order, may be generated but are not depicted, but will be discussed later). The first order and minus first order diffraction beams reflect on a surface of the target TA (by means of reflection and/or by means of a zero order diffraction effect), thereby again reaching the first grating GR1 and again being diffracted by it. In this embodiment, the first order diffractions are incident on first retroreflectors RFL1 and travel (seen in the perspective of the figure) a same route back to a first detector SE1, thereby again being diffracted by the first grating twice. The retroreflectors may be formed by corner cubes, which may provide that the beam reflected back is translated in the y direction (i.e. in the plane of drawing). Another retroreflector architecture is provided in case the first grating GR1 is a 2-dimensional (e.g. cross-) grating and a reflective plane. Namely, the first grating GR1 will deflect the beam in the Y-direction, which in turn encounters the reflective plane and the first grating GR1 again bending the beam towards the target TA. A tilt sensitivity is obtained: firstly, as depicted in FIG. 2, a tilting TL of the target TA will shift the beam that is reflected back by the target TA, over the first grating by in this example a distance SH. Thereby, during such tilting (periodic) changes in intensity as received back towards the first detector SE1 will occur due to the periodic nature of the grating GR1. Secondly, a total path length towards the retroreflector increases for one of the paths where the target moves up due to the tilting and decreases for the other one of the paths where the target moves down due to the tilting. Combination of the beam along the two paths will thereby result in phase differences, resulting in a change in amplitude as received by the detector SE1. As the first retroreflectors RFL1 are in this embodiment configured to reflect the first order beams, the effects of path length and grating in this embodiment add to each other so as to increase sensitivity. The combination of effects of path length and phase difference allow to increase a sensitivity of the position detection. Furthermore, only intensity detection may be required, which enables to make use of a photodiode (i.e. a stable, convenient and low cost item) as the detector. The change in amplitude allows for utilization of a photo diode for detection instead of position sensitive devices, hence enabling wireless sensing. The retroreflector is arranged to reflect the beam back to the first grating at a position that is substantially the same as the diffraction of the beam before reaching the retroreflector, as seen in the direction into which the diffraction by the first grating diffracts. The direction towards which the diffraction by the first grating diffracts so that the diffracted beam obtains a component in that direction, is in this document also referred to as the first diffraction direction. Phase effects and/or path length effects encountered by the beam on its way from the transmitter to the retroreflector, will substantially occur again in the optical path from the retroreflector to the detector, which may positively affect a sensitivity of the position sensor.

Figure 3:
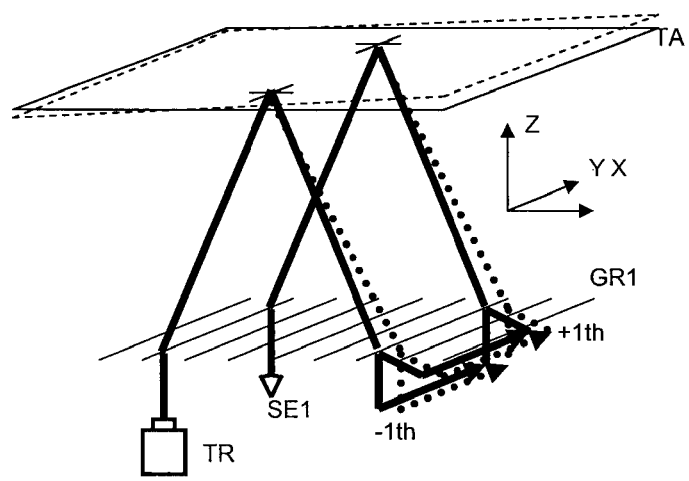
FIG. 3 depicts a schematic view of a position sensor according to another embodiment of the invention.

FIG. 3 shows a perspective view and depicts a variation to the embodiment of FIG. 2. Here, in deviation from the embodiment depicted in FIG. 2, both first order and minus first order of the twice diffracted beam are reflected by the retroreflector (in this example corner cubes), a combination of contributions being received by the first detector SE1. The above mentioned effect of the periodic character of the grating is used here, as an increase in the first order diffraction combined with a decrease in minus first order and vice versa. As only one of the first order and minus first order diffraction beams of the first diffraction on the grating GR1 is applied, the path length variation effect is cancelled out.

Figure 4:
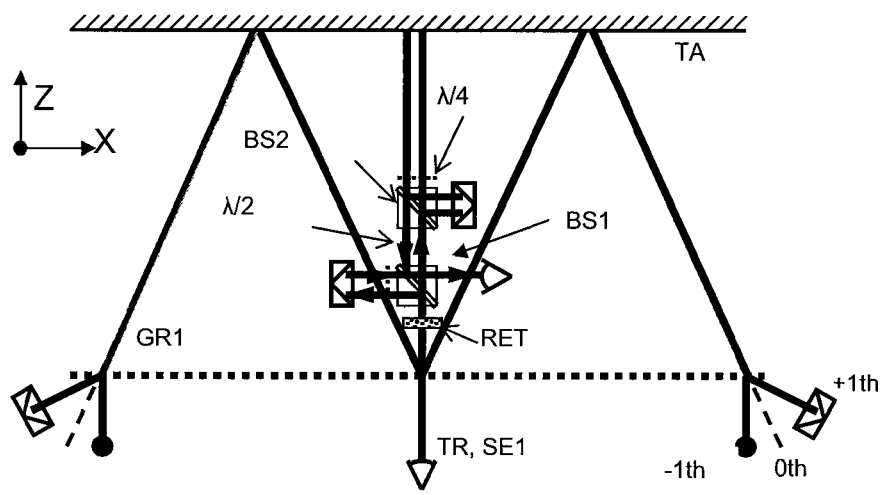
FIG. 4 depicts a schematic view of a position sensor according to yet another embodiment of the invention.

FIG. 4 depicts a same sensor as described with reference to FIG. 2, however additionally an interferometer has been added, a beam of the interferometer being formed by a zero order diffraction beam at the first diffraction of the beam from the transmitter. In order to achieve a degree of tilt insensitivity (as well as increasing sensitivity of the measurement in z direction), the interferometer is arranged to reflect the interferometer beam onto the target twice. The configuration depicted in FIG. 4 enables a measurement of vertical position of the target (i.e. in Z direction) and tilt of the target TA, hence provides out of plane (i.e. out of the horizontal XY plane) measurement. An embodiment of the interferometer is depicted in more detail in FIG. 5: The zero order diffraction beam from the first grating GR1 passes retarder RET and a first beam splitter BS1. Here, the beam is split in a reference beam which is directed to the interferometer detector ISE via retroreflector IRFL (e.g a corner cube) and quarter lambda plate, and a beam which travels via a second beam splitter BS2 to the surface of the target TA, where it reflects. The reflected beam is directed by the second beam splitter BS2 to another retroreflector IRFL which reflects the beam back to the second beam splitter BS2, however translated, so that, after being reflected by the second beam splitter, it is reflected again by the target, however translated in respect of the other reflection. The beam then passes the second beam splitter BS2 and is reflected by the first beam splitter BS1 to the detector ISE. Quarter lambda and half lambda plates are provided as depicted. In case the target TA is a grating, it may influence beam polarization and in such may contribute to the effects aimed at by the quarter lambda plate, yielding yet another setup.

Figure 6A:
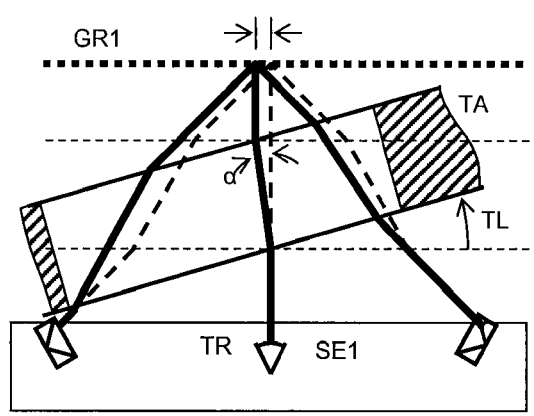
FIG. 6A-C depict schematic views of position sensors according to yet still other embodiments of the invention.

Before disclosing how a sensing of further degrees of freedom may be added, some alternative embodiments to the tilt sensor depicted in FIGS. 2 and 3 are disclosed. FIG. 6A depicts an embodiment of the sensor whereby instead of a reflective target, a (partly) transmissive target is used. The beam from the transmitter TR first passes through the transmissive part of the target. Then, it reflects on the first grating GR1 (which is in this embodiment reflective and configured to reflect the beam and first and minus first order diffraction beams, after having passed the transmissive part of the target, back to the transmissive part of the target). The first and minus first order reflection beams are then reflected by retroreflectors RFL1, so as to travel back in a similar way to the first detector SE1, thereby being diffracted by the grating GR1 again. As a result of the tilting TL of the transmissive part of the target TA, the place where the beam is incident on the grating GR1 is displaced due to the change of incident angle and refractive index on the target TA, which results in a change in the intensities of the first and minus first order diffraction beams, which is then detected by the detector SE1.

Figure 6C:
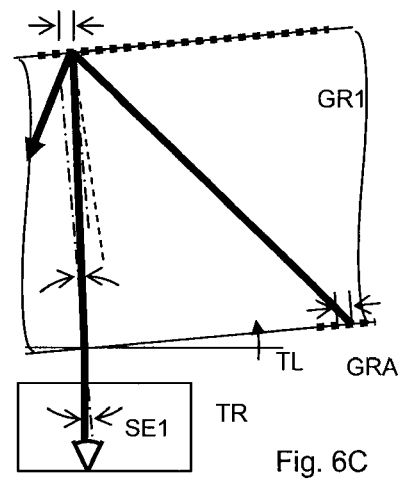
Figure 6B:
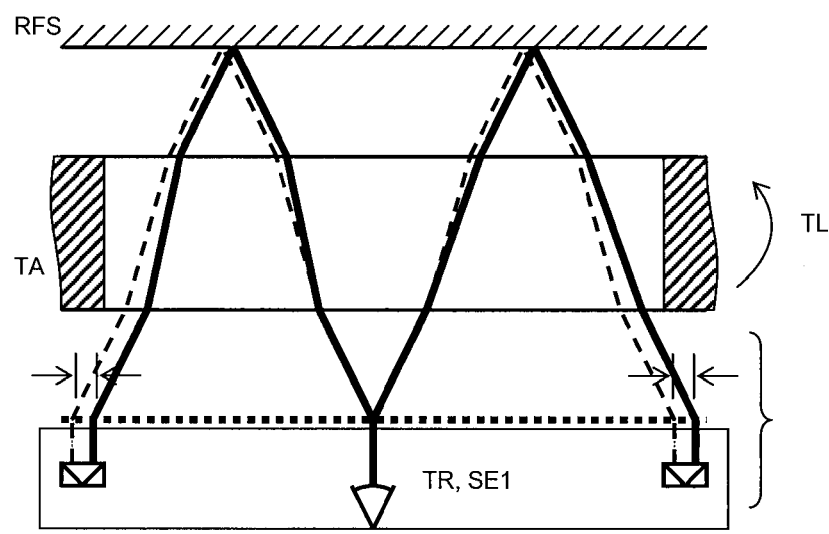

Another alternative embodiment is depicted in FIG. 6B. Here, again a transmissive part of or connected to the target TA may be applied. Similarly to the embodiment in FIGS. 2 and 3 however, the first grating GR1 is however positioned at the transmitter TR and first detector SE1 side. The beam from the transmitter is diffracted by the first grating GR1, first and minus first order diffraction beams pass the transmissive part of the target TA and reflect on a reflective surface RFS. The reflected beams again pass through the transmissive part and are again diffracted by the first grating GR1. In FIG. 6B, a minus first order diffraction beam is reflected back by first retroreflectors RFL1, and travels a same way back to the first detector SE1, thereby being diffracted by the first grating GR1 twice. However, the first order diffraction beam may be applied instead of the minus first order diffraction beam, for the same reasons as given for FIG. 2. Tilt sensitivity is obtained, as the diffracted beams are displaced relative to the first grating GR1 when tilting the (transmissive part of or connected to the) target TA, hereby enhancing resolution by including incident angle and refractive index effects as shown in FIG. 6A as well. The reflective surface RFS may become part of the target TA, for instance at the top surface. It will be appreciated that when placing the RFS at the bottom surface, the configuration of FIG. 2 is obtained, hence canceling the effect of the incident angle and refractive index. Furthermore, a configuration as depicted in FIG. 3 may be applied here as well.

Yet another alternative embodiment is depicted in FIG. 6C. In this embodiment, the grating GR1 is reflective and provided on a surface of the transmissive part of the target. The beam, travelling through the transmissive part of the target, is diffracted and reflected by the first grating GR1 and travels to an auxiliary grating GRA provided at an opposite surface of the transmissive part of the target TA, but may be provided as part of the counterpart of the target TA as well. There, it is diffracted again and travels (possibly via a retroreflector and the grating GRA again) a similar path back to the detector SE1. As a result of tilting TL of the target, a displacement of the beam on the grating GR1 is achieved, resulting in a similar effect as described above.

It will be understood that in the embodiments in accordance with FIGS. 6A-6C, the transmissive part may form part of the target but may alternatively be connected to the target.

Figure 5:
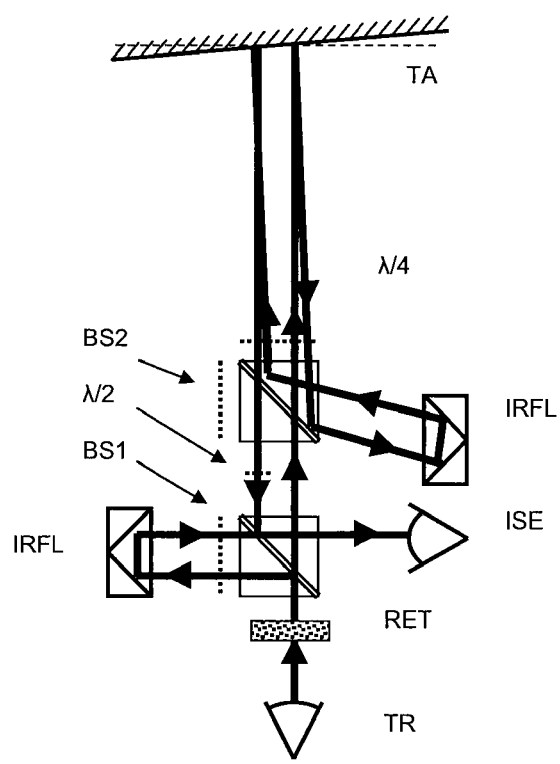
FIG. 5 depicts a detailed view of a part of the position sensor according to FIG. 4.

The embodiments as depicted in and described with reference to FIGS. 6A-6C may be combined with a same or similar interferometer configuration as depicted and described with reference to FIGS. 4 and 5, so as to add a Z position measurement to the tilt measurement. Furthermore, it will be understood that a refractive index of the transmissive part of the target differs from a refractive index of the surrounding medium, so as to achieve the refraction by the transmissive part, as depicted.

It is remarked that, in any of the embodiments in accordance with FIGS. 2, 3, 6A-6C instead of adding an interferometer, the z position may also be measured by the sensors as disclosed in these figures, as a translation in z direction resulting in a shift of the beam on the grating in the horizontal direction. Using multiple of the described sensors, tilt and position in z direction may be separated from the multiple measurements provided by these sensors. Still further in the described embodiments, the z position may be measured by another sensor, such as a capacitive sensor, acoustical sensor or linear optical sensor.

The examples depicted in and described with reference to FIGS. 2, 3, 6A-6C may be applied to measure a tilt about the X axis as well as about the Y axis (i.e. in lithography terms to measure "tip" and "tilt"), by replication of the disclosed configurations perpendicular to the shown configurations. Thereto, a two dimensional first grating GR1 may be applied so as to diffract the beam from the transmitter towards the x direction (as a diffraction direction) as well as towards the y direction (as a diffraction direction).

Examples of applications of the embodiments of FIGS. 6A to 6C in a lithographic apparatus may include: the embodiment in accordance with FIG. 6A may be applied to measure a short stroke position relative to a long stroke; the target thereby being provided by the short stroke, while the first grating, detector and retroreflectors are provided at the long stroke. The first grating GR1 may thereby be provided on the metrology frame MF or other reference structure of the lithographic apparatus as well. The embodiment in accordance with FIG. 6B may be applied to measure a short stroke position relative to a long stroke (the target thereby being provided by the short stroke, while the first grating, detector and retroreflectors are provided at the long stroke). The reflective surface RFS may thereby be provided on the metrology frame MF or other reference structure of the lithographic apparatus, or the short stroke or long stroke as well. In such application, both the embodiments in accordance with FIGS. 6A and 6B provide a measurement of the target, thus the short stroke, in respect of the reference structure, such as for instance the metrology frame or the long stroke. The embodiment as depicted in and described with reference to FIG. 6C may also be applied to measure a short stroke position, however provides an example of a measurement of the short stroke position relative to the long stroke. Thereto, the grating GR1 and transmissive part are provided on the short stroke, while the detector SE1 is provided on the long stroke.

Similar the embodiments depicted in and described with reference to FIGS. 2, 3, 6A-6C may be applied in for example short stroke to long stroke metrology, short stroke to metrology frame (or other reference structure) metrology and/or long stroke to metrology frame (of other reference structure) metrology. In these configurations, the various metrology components (e.g. TR, SE1, GR1, TA) may be placed at different structures. As an example for short stroke to metrology frame metrology: transmitter TR and detector SE1 are placed on a balance mass, beam steering optics and retroreflectors RFL1 on a long stroke, grating GR1 on the short stroke and reflective surface RFS on the metrology frame.

An example of a 6 degree of freedom sensor will now be described with reference to FIG. 7. FIG. 7 depicts a top view of an embodiment of the position sensor. Transmitter TR, first detector SE1, and first retroreflectors RFL1 may correspond to the ones depicted and described with reference to FIG. 2. A diffraction on first grating GR1 provides first diffraction beams including a first and minus first order diffraction, having obtained a directional component in the x direction. Additionally, the target, which is in FIG. 2 and the description thereto referred to as reflective, is provided with second (in this example reflective) gratings GR2. A zero order diffraction by each of the second gratings GR2 follows the path as depicted in and described with reference to FIG. 2 and arrives at detector SE1 to provide out of plane (i.e. out of the x/y plane) position sensing, such as tilt or z-position. Second retroreflectors RFL2 are provided, configured to reflect first order and minus first order diffractions from the second gratings GR2 (also referred to as second diffraction beams) via the first grating GR1 (such as depicted in FIG. 2 for tilt metrology). These diffractions have obtained, due to the diffraction, a directional component in the y direction. One of the first diffraction orders in y direction originating from the second encounter with the first grating GR1 is reflected by the retroreflectors. Note that the grating structures at the first grating GR1 at the position of the second encounter are perpendicular with respect to each other in view of ry versus y metrology. For this two perpendicular gratings may be applied as well as a cross grating (i.e. two dimensional grating). These retroreflectors RFL2 impose a shift in x direction (i.e. perpendicular to the measurement direction) to separate the incoming and returning beam before returning the beam to the first grating GR1 for the third time and back to the second grating to be diffracted by the second grating again. The diffracted beams are each detected by a second detector SE2. A displacement of the target in Y direction will result in the pattern GR2 to displace in the Y direction, which will have effect on the first and minus first order diffractions at the second grating, which is hence detected by the second detectors SE2 as a periodic signal (a periodicity being determined by the periodicity of the pattern of the second grating GR2. It will be understood that for a measurement of the position in Y direction, only one second detector and one second grating would suffice. However, in the embodiment as depicted, a rotation of the target in the plane of drawing, i.e. in respect of the z-axis, may be derived from a difference between the measurements by the two second detectors SE2.

In the embodiment in accordance with FIG. 7, the first grating may include a two dimensional grating (e.g. cross grating). Thereby, diffraction at the first grating not only provides beams extending in the x direction, but also beams extending in the y direction. Replication of the sensor architecture including the first retroreflector RFL1, the first detector SE1, the second grating(s) GR2 and second retroreflectors RFL2 applied 90 degrees rotated (in the x-y plane and about the transmitter TR) provides for a further first retroreflector RFL1, a further first detector SE1, further second grating(s) GR2 and a further second retroreflectors RFL2, which may provide for a measurement of rx (by the further first detector SE1), a measurement of x and rz by the further detectors SE2. Adding an interferometer as disclosed with reference to FIGS. 4 and 5, or the diffraction based optics alternative where a translation in z results in a horizontal shift of the beam on the first grating GR1, allows a combined 6 degrees of freedom position measurement. Application of a two dimensional grating for the second grating(s) GR2 allows for an (theoretically) infinite measurement range in x- and y-direction in view of periodic structure availability. Reverting to applications in a lithographic apparatus, a single one of the sensor thus obtained may be provided to measure a position of a movable part, such as a stage in a lithographic apparatus. Due to the potentially compact nature and low component count (hence potentially relatively low cost), it is however also possible that a plurality of these sensors are provided at various parts of the stage thereby allowing to obtain information about flexing, resonances and other non rigid body behavior of the stage.

A sensitivity of the interferometer as depicted in and described with reference to FIG. 5 may be enhanced by reflecting the beam onto the target a plurality of times. Thereto, a plurality of beam splitters and mirrors may be provided that may provide a repetitive structure each repetition reflecting the beam on the target. In the embodiment depicted in FIG. 8A, in addition to the beam splitters and retroreflectors similar to the configuration in accordance with FIG. 5, the retroreflector adjacent to the second beam splitter BS2 is replaced by a repetition on two beam splitters and two mirrors, each repetition configured to reflect the beam twice on the target. At the end of such a chain of one, two or more repetitions, a reflector is provided, to arrange for the beam travelling back via the repetitive structures, thereby again being reflected onto the target plural times. In FIG. 8B, instead of separate beam splitters and separate mirrors, the second beam splitter BS2 has been replaced by an assembly of a second and third beam splitter BS2, BS3, splitting surfaces of the second BS2 and third BS3 beam splitter being arranged in a V shaped configuration under an angle of substantially 90 degrees in respect of each other and configured such that a beam reflected from the target onto the second beam splitter may be reflected to the third beam splitter and from there to the target again. Similarly, a V shaped mirror configuration including mirrors arranged substantially 90 degrees in respect of each other, is provided that reflects a beam that passed the second beam splitter to the third beam splitter, and vice versa. A center axis of the V shaped mirror configurations is offset in respect of a center axis of the V shaped beam splitter configuration, so that successive reflections of the beams onto the target are offset. Another configuration is depicted in FIG. 8C. In the embodiment depicted in FIG. 8C, in addition to the beam splitters and retroreflectors similar to the configuration in accordance with FIG. 5, the retroreflector adjacent to the second beam splitter BS2 is replaced by a repetition of beam splitters and a horizontal mirrors, each repetition configured to reflect the beam once on the target. At the end of such as chain of one, two or more repetitions, a reflector is provided, to arrange for the beam travelling back via the repetitive structures, thereby again being reflected onto the target plural times. The horizontal mirrors may be combined into a single mirror to allow a compact and stable setup. The configurations as depicted in FIGS. 8A-8C may be separately rotated per 'beam splitter arrangement' around the z-axis (i.e. around the axis of metrology), for instance as to obtain a more compact solution or provide for improved tip/tilt insensitivity.

In this document, the term position is to be understood so as to include a position in any one degree of freedom, i.e. x, y, z, rx, ry, rz or any combination of two or more thereof. The term beam is to be understood so as to include any kind of radiation beam, including but not restricted to visible, infrared, ultraviolet radiation. In the embodiments depicted in FIGS. 2-8, the x direction may be generally be understood as an example of a first diffraction direction, while the y direction may be understood as an example of a second diffraction direction. A propagation direction of radiation beam from the source follows in these embodiments the z direction. As depicted in the embodiments, the first and or second grating substantially extends in the xy plane, thus in the plane of the first and second diffraction directions. Any other arrangement may be applied. The expression "diffraction in a diffraction direction" or "diffraction towards a diffraction direction" are to be understood as a diffraction, whereby a direction of the beam is altered due to the diffraction so as to obtain a directional component in the diffraction direction. In the examples depicted in FIGS. 2, 3 and 6A-6C, the diffraction direction is thus to be understood as a direction from left to right (or vice versa) in the plane of drawing, as the vertical beam from the transmitter incident on the grating, provides a first (and/or minus first) order diffraction beam that has obtained a direction having a horizontal (left to right or vice versa) direction component.

Throughout the FIGS. 2-7, a first order diffraction is generally referred to as +1, while a minus first order diffraction is generally referred to as −1.

Generally, the first diffraction beam and second diffraction beam are to be understood as first order (and/or minus first order) diffraction beams, however second or higher order diffractions may also be provided.

The term diffraction is to be understood so as to include a reflective diffraction and/or a transmissive diffraction.

Part(s) of the different figures may be combined, resulting in new, custom made measurement setups. Hereby obtaining metrology configurations measuring a single or up to six degree(s) of freedom per configuration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A position sensor configured to measure a position data of a target, the position sensor comprising:
   a radiation source configured to provide a radiation beam, the radiation beam having a propagation direction;
   a first grating configured to diffract the radiation beam into at least a first diffraction beam having a propagation direction component in a first diffraction direction that is substantially perpendicular to the propagation direction;

a second grating, arranged in an optical path of the first diffraction beam, the second grating being configured to diffract the first diffraction beam diffracted at the first grating into at least a second diffraction beam having a propagation direction component in a second diffraction direction substantially perpendicular to the first diffraction direction and to the propagation direction, the second grating being connected to the target;

a first detector configured to detect at least a part of the first diffraction beam diffracted by the first grating; and a second detector configured to detect at least part of the second diffraction beam diffracted by the first grating and the second grating.

2. The position sensor of claim 1, further comprising
a first retroreflector;
a forward optical path provided from the radiation source, via at least one first order diffraction by the first grating and a zero order diffraction by the second grating, to the first retroreflector; and
a reverse optical path provided from the first retroreflector via a zero order diffraction by the second grating and at least one first order diffraction by the first grating to the first detector.

3. The position sensor of claim 2, wherein the first retroreflector is configured to reflect the incident first order diffraction beam so as to be incident again on the first grating at substantially a same position seen along the first diffraction direction.

4. The position sensor of claim 2, further comprising
a second retroreflector;
a second forward optical path provided from the radiation source, via at least one first order diffraction by the first grating and a first order diffraction by the second grating, to the second retroreflector; and
a second reverse optical path provided from the second retroreflector via a first order diffraction by the second grating and at least one first order diffraction by the first grating to the second detector.

5. The position sensor of claim 1, comprising two second gratings and two second detectors.

6. The following is an examiner's statement of reasons for allowance: the prior art fails to teach or reasonably suggest a position sensor configured to measure a position data of a target, or a lithographic apparatus comprising the same, the position sensor comprising:

a radiation source configured to provide a radiation beam, the radiation beam having a propagation direction;

a first grating configured to diffract the radiation beam into at least a first diffraction beam having a propagation direction component in a first diffraction direction that is substantially perpendicular to the propagation direction;

a second grating, arranged in an optical path of the first diffraction beam, the second grating being configured to diffract the first diffraction beam diffracted at the first grating into at least a second diffraction beam having a propagation direction component in a second diffraction direction substantially perpendicular to the first diffraction direction and to the propagation direction, the second grating being connected to the target;

a first detector configured to detect at least a part of the first diffraction beam diffracted by the first grating; and a second detector configured to detect at least part of the second diffraction beam diffracted by the first grating and the second grating.

7. The position sensor of claim 1, further comprising an interferometer, an input beam of the interferometer being provided by a zero order diffraction beam of the first grating.

8. The position sensor of claim 7, wherein the interferometer comprises dual beam splitters and dual interferometer retroreflectors and is configured to reflect the interferometer beam on the target twice.

9. The position sensor of claim 7, wherein the interferometer comprises a plurality of beam splitters to reflect the beam onto the target at least three times.

10. The position sensor of claim 1, wherein the second grating is reflective to reflect at least part of the first diffraction beam diffracted at the first grating from the first grating, back to the first grating, the first retroreflector being positioned to reflect a diffraction beam that is diffracted from the first order diffraction beam diffracted at the first grating that is reflect by the second grating.

11. The position sensor of claim 10, wherein the first retroreflector is configured to reflect a first order and minus first order diffraction beam.

12. The position sensor of claim 10, further comprising a further first retroreflector, wherein the second grating is reflective to reflect at least part of the first order and minus first order diffraction beam from the first grating, back to the first grating, the first retroreflector being positioned to reflect a first order diffraction beam that is diffracted from the first order diffraction beam from the first grating that is reflect by the second grating back to the first grating, the further first retroreflector being positioned to reflect a first order diffraction beam that is diffracted from the minus first order diffraction beam from the first grating that is reflect by the second grating back to the first grating.

13. The position sensor of claim 1, arranged to transmit the first order diffraction beam as diffracted by the first grating through a transmissive part of the target.

14. A lithographic apparatus arranged to transfer a pattern from a patterning device onto a substrate, comprising a stage and at least one position sensor of claim 1 configured to measure a position of the stage.

15. A lithographic apparatus arranged to transfer a pattern from a patterning device onto a substrate, comprising a stage and at least 2 of the position sensors of claim 1, each of the position sensors being configured to measure the position of the stage.

16. A lithographic apparatus arranged to transfer a pattern from a patterning device onto a substrate, comprising a stage and at least 4 of the position sensors of claim 1.

17. The position sensor of claim 16, wherein the first detector comprises a photodiode and is configured to provide an output signal representative of an intensity of a detected beam.

18. A lithographic apparatus arranged to transfer a pattern from a patterning device onto a substrate, comprising a stage and at least 6 of the position sensors of claim 1.

* * * * *